(12) United States Patent
Novichkov et al.

(10) Patent No.: US 8,633,040 B2
(45) Date of Patent: Jan. 21, 2014

(54) METHOD FOR SYNTHESISING SEMICONDUCTOR QUANTUM DOTS

(75) Inventors: Roman Vladimirovich Novichkov, Dubna (RU); Maxim Sergeevich Wakstein, Dubna (RU); Ekaterina Leonidovna Nodova, Dubna (RU); Aleksey Olegovich Maniashin, Dubna (RU); Irina Ivanovna Taraskina, Dubna (RU)

(73) Assignee: The "Nanotech-Dubna" Trial Center for Science and Technology, Dubna, Moskovskaya (RU)

( * ) Notice: Subject to any disclaimer, the term of this patent is extended or adjusted under 35 U.S.C. 154(b) by 224 days.

(21) Appl. No.: 13/060,046

(22) PCT Filed: Aug. 18, 2009

(86) PCT No.: PCT/RU2009/000413
§ 371 (c)(1),
(2), (4) Date: May 9, 2011

(87) PCT Pub. No.: WO2010/024724
PCT Pub. Date: Mar. 4, 2010

(65) Prior Publication Data
US 2011/0269297 A1    Nov. 3, 2011

(30) Foreign Application Priority Data
Aug. 21, 2008   (RU) .............................. 2008134160

(51) Int. Cl.
*H01L 21/00*  (2006.01)
*H01L 21/20*  (2006.01)
*H01L 21/36*  (2006.01)

(52) U.S. Cl.
USPC ............. 438/22; 438/492; 438/493; 438/502; 257/E21.404; 977/774; 977/784; 977/813; 977/825

(58) Field of Classification Search
USPC .......... 438/22, 478, 492–509, 962; 257/9, 14, 257/20, E33.008, E31.033, 257/E29.069–E29.076, E29.168, E49.003, 257/E21.404; 977/774, 784, 813, 825
See application file for complete search history.

(56) References Cited

U.S. PATENT DOCUMENTS

| | | | |
|---|---|---|---|
| 2007/0295266 A1 | 12/2007 | Lee et al. | |
| 2010/0163806 A1* | 7/2010 | Chang et al. | ............... 252/408.1 |
| 2011/0233468 A1* | 9/2011 | Zong et al. | ............. 252/301.6 R |

FOREIGN PATENT DOCUMENTS

CN    101215467    7/2008

\* cited by examiner

*Primary Examiner* — Calvin Choi
(74) *Attorney, Agent, or Firm* — Steven M. War, Esq.

(57) ABSTRACT

The invention can be used for producing different luminescent materials and as a basis for producing subminiature light-emitting diodes, white light sources, single-electron transistors, nonlinear optical devices and photosensitive and photovoltaic devices. The inventive method for producing semiconductor quantum dots involves synthesizing nanocrystal nuclei from a chalcogen-containing precursor and a precursor containing a group II or IV metal using an organic solvent and a surface modifier. The method is characterized in that (aminoalkyl)trialkoxysilanes are used as the surface modifier, core synthesis is carried out at a permanent temperature ranging from 150 to 250 C for 15 seconds to 1 hour and in that the reaction mixture containing the nanocrystal is additionally treated by UV-light for 1-10 minutes and by ultrasound for 5-15 minutes.

13 Claims, 6 Drawing Sheets

METHOD FOR SYNTHESISING SEMICONDUCTOR QUANTUM DOTS

CROSS-REFERENCE TO RELATED APPLICATIONS

This application claims priority to International Patent Application No. PCT/RU2009/000413 (published as WO/2010/024724) with an international filing date of Aug. 18, 2009, which claims priority to RU 2008134160 filed on Aug. 21, 2008, the contents of which are incorporated herein in their entirety by reference.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

BACKGROUND OF THE INVENTION (1) Field of the Invention

The invention relates to obtaining, by the colloid synthesis method, of semiconductor quantum dots of the core and the core-shell type, possessing high luminescence in the visible spectrum, high photostability, and dispersible in various solvents.

(2) Description of Related Art Including Information Disclosed Under 37 CFR 1.97 and 1.98

The method suggested by Bawendi et al. (JACS, 11, 8706 (1993)) can be taken as the basis of modern methods for colloid synthesis of quantum dots. In the typical synthesis, a reaction flask is filled with a coordinating solvent-trioctylphosphineoxide, heated up to 300 C in argon, and then a mixture of dimethylcadmium and trioctylphosphine selenide is syringed through a septum.

BRIEF SUMMARY OF THE INVENTION

The invention can be used for producing different luminescent materials and as a basis for producing subminiature light-emitting diodes, white light sources, single-electron transistors, nonlinear optical devices and photosensitive and photovoltaic devices. The inventive method for producing semiconductor quantum dots involves synthesizing nanocrystal nuclei from a chalcogen-containing precursor and a precursor containing a group II or IV metal using an organic solvent and a surface modifier. The method is characterized in that (aminoalkyl)trialkoxysilanes are used as the surface modifier, core synthesis is carried out at a permanent temperature ranging from 150 to 250 C for 15 seconds to 1 hour and in that the reaction mixture containing the nanocrystal is additionally treated by UV-light for 1-10 minutes and by ultrasound for 5-15 minutes. The invention makes it possible to increase the photostability of semiconductor quantum dots up to 34% and the capacity thereof to be dispersed in both non-polar and polar solvents, so that the quantum yields are preserved and increased.

BRIEF DESCRIPTION OF THE FIGURES

FIG. 1—Semiconductor quantum dot surface hydrolysis covered with (amino alkyl)trialkoxysilane, where:

R is alkyl radical in the aminoalkyl group;
R' is alkyl radical in the alkoxysilane group.

DETAILED DESCRIPTION OF THE INVENTION

This invention can be used for production of various luminescent materials and as a basis for producing subminiature light-emitting diodes, white light sources, single-electron transistors, nonlinear optical devices and photosensitive and photovoltaic devices.

A disadvantage of this method is a low fluorescence quantum yield due to the defective nanocrystal surface which leads to occurrence of energy levels inside the band gap. These levels act as the traps for electrons and holes thus impairing the luminescent properties of the quantum dots. The second disadvantage is the use of toxic organometallic reagents, which ignite spontaneously in air.

The next step to improve the luminescent properties of the quantum dots was growing of a shell over the core from semiconductors with wider band gap (J. Phys. Chem., 100, 468 (1996)). These quantum dots are more stable than those produced by Bawendi's method, including during processing when incorporated in devices. In the typical synthesis, trioctylphosphineoxide was heated up 350 C in argon, and then a mixture of dimethylcadmium, selenide trioctylphosphine and trioctylphosphine was injected through the septum. Finally, at about 310 C CdSe cores of the quantum dots are formed. Further on, for growing the semiconductor shell, at 300 C. several equal portions of dimethylzinc, bis(trimethylsilyl)sulfide and trioctylphosphine mixture were injected. The described method produces CdSe/ZnS quantum dots with high quantum yield, up to 50% at room temperature. Thus, the disadvantages of the previous method are eliminated.

The disadvantage of this method is a wide size distribution (12-15%) of the cores and final quantum dots and, consequently, low color purity. This method also involves pyrophorous compounds, which is extremely dangerous.

Another method for producing semiconductor nanocrystals comprises high-temperature synthesis of the cores containing a group VI chalcogenide and a group II metal in an organic solvent (published US Application US20060275544). Produced nanocrystals have high quantum yield (up to 50% fluorescence in the visible spectrum) with relatively narrow size distribution (the full width at half maximum is 40 nm or lower).

The disadvantage of this method is the use of toxic, pyrophorous and unstable reagents which require special equipment to be used and special conditions to be met, which is unsuitable for the industrial applications. Dimethylcadmium, the reagent extremely toxic, pyrophorous, expensive and unstable at room temperature, is used (Murray et al., J. Am. Chem. Soc., 1993, 115, 8706-8715; Barbera-Guillem et al. U.S. Pat. No. 6,179,912; Peng et al., Nature, 2000, 404, 69-61; Peng et al., J. Am. Chem. Soc., 1998, 120, 5343-5344). At temperature required for the synthesis (340-360 C), dimethylcadmium explodes with the release of large amounts of gas.

Another disadvantage of this method is inability to provide monodispersiveness of the quantum dots: only a relatively monodispersed CdSe can be synthesized (Peng et al., JACS, 1998, 120, 10, 5343-5344) by controlling the monomer concentration in the primary reaction mixture and regulating the crystal growth time.

A method of quantum dot production is known, which includes high-temperature synthesis of nanocrystals from a group VI chalcogen precursor and a group II or a group IV metal precursor using an organic solvent and a surface modifier (U.S. Pat. No. 7,105,051, published in 2006, IPC C30B 25/12). This invention is better than the previous ones, because no toxic and pyrophorous organometallic precursors are used. In this case, high quality quantum dots having small size and narrow size distribution are obtained. A non-coordinating solvent is used in the process.

This method is disadvantageous because, despite a considerable success in modernizing QD optical properties (quantum yield, fluorescence peak width), the attempts to synthesize highly photostable nanocrystals failed. It is suggested that UV-irradiation in air of the nanocrystals produced by the above-described methods will significantly reduce fluorescence. The exclusion is quantum dots of CdSe/ZnS composition, but this requires mandatory application of toxic and pyrophorous organometallic precursors. This makes the industrial synthesis not possible and significantly reduces the possibility of wide QD application in various fields of science and technology.

Many of the above disadvantages, for instance, impossibility of industrial production and the necessity of organometallic precursors, are eliminated in the invention under published US Application No. 20070295266, which is the closest analogue to the invention claimed by us.

The known method for producing quantum dots, taken as a prototype, comprises high-temperature synthesis of the nanocrystal cores from a group VI chalcogen precursor and a group II metal precursor with the use of an organic solvent and a surface modifier (US Application No. 20070295266, class C30B 13/02, 117/53, published on 27 Dec. 2007). In this method, to increase the quantum yield, a semiconductor shell is grown containing the group II metal and the group VI chalcogenide.

The disadvantage of this method is supposed low photostability of the produced quantum dots, which primarily depends on coordinating ligands bonding with the surface of nanoparticles. The nanoparticle surface is highly stressed and, consequently, highly reactive and inclined to oxidation. The above-described method applies surfactants (trioctylphosphineoxide, hexadecylamine, etc.) unable to provide a long-term stable bonding with the quantum dot surface. This very fact leads to photooxidation of the quantum dots and loss of fluorescence.

Semiconductor quantum dots synthesized using the surfactant described in the prototype are only dispersed in non-polar organic solvents. To transfer the semiconductor quantum dots into a polar solvent, the adsorption monolayer on their surface should be changed. Replacement of a single-polar surfactant by a bipolar surfactant in the adsorption monolayer requires additional treatment that makes synthesis very complicated and causes high fluorescence losses.

The goal of this invention is to develop a method for producing quantum dots with high photostability, dispersible both in polar and non-polar solvents without additional treatment, while preserving or even increasing the high quantum yield.

The technologic result is the increased photostability and ability to disperse in both polar and non-polar solvents without additional treatment.

In this invention, the problem is solved and the technologic result is reached by applying the method for producing semiconductor quantum dots on the basis of group II or IV metal chalcogenides, which includes nanocrystal core synthesis from a precursor containing a chalcogen and a precursor containing a group II or IV metal with the use of an organic solvent and the surface modifier, where the latter is (aminoalkyl)trialkoxysilanes. The cores are synthesize at a constant temperature ranging within 150-250 C for 15 seconds to 1 hour, with additional treatment of the reaction mixture containing nanocrystal cores with UV light for 1-10 minutes and with ultrasound during 5-15 minutes.

Figure 2:
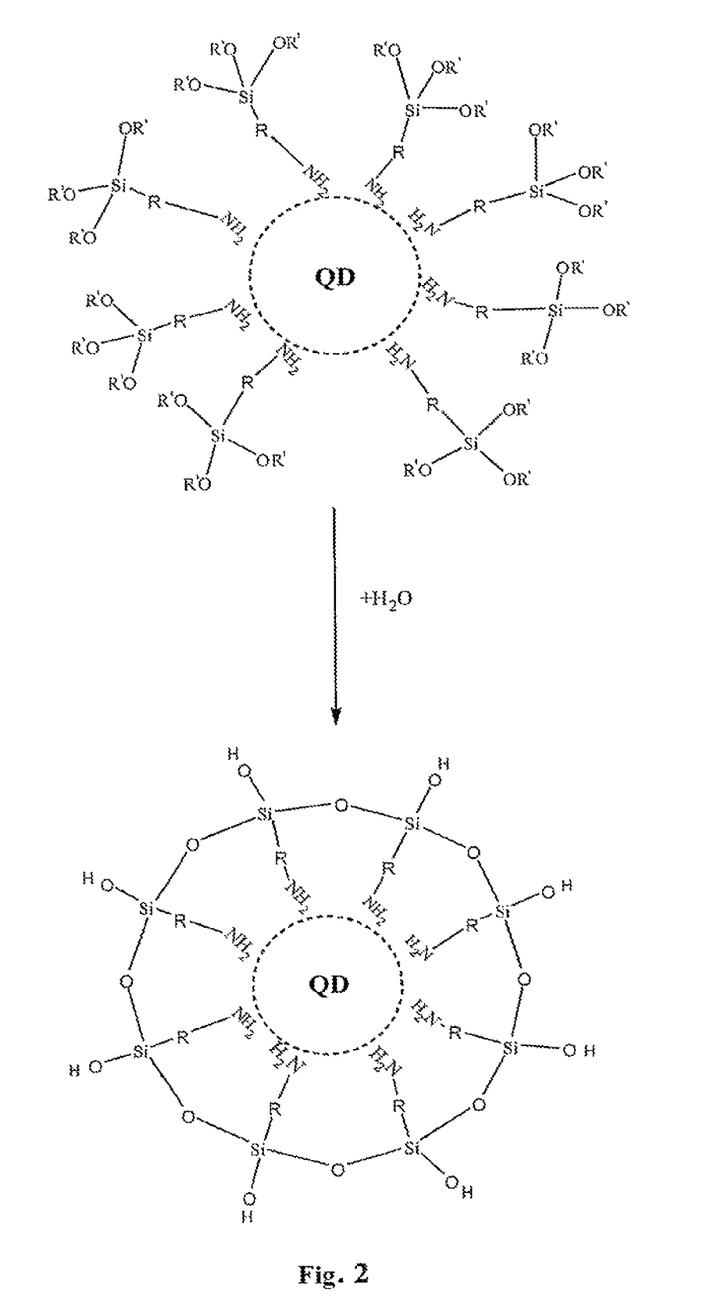
FIG. 2 shows the ability of quantum dots to dissolve in water.

The significance of the features is explained as follows:
UV light irradiation reduces the quantity of defects on the semiconductor quantum dot surface and ultrasonic treatment allows for higher disaggregation of semiconductor quantum dot cores, which, in turn, causes more homogeneous growth of the shell. This produces quantum dots more homogeneous in size, with higher photostability, as compared with those synthesized by the common method;

substitution of typical surfactants (trioctylphosphineoxide, hexadecylamine, etc.) by an organosilicon surface modifier, for example, (3-aminopropyl)trimethoxysilane, forms a strong organosilicon shell on the semiconductor quantum dot surface that prevents the quantum dots against oxidation and impact of fluorescence extinguisher and provides nanocrystal dispersion in polar and non-polar solvents. Primarily, the organosilicon shell is hydrophobic, but hydrolysis in a polar solvent makes it hydrophilic owing to the presence of polar hydroxyl groups on the shell surface (FIG. 2).

In the preferential option, when, besides a photostability, an increased quantum yield is desirable, prior to the reaction mixture treatment by UV light and ultrasound, the semiconductor shell is grown at a constant temperature within 150-250 C during 10 min to 1 h, which contains a group II metal chalcogenide with (aminoalkyl)trialkoxysilanes applied as the surface modifiers.

The increased quantum yield and photostability can also be reached, when after UV-light and ultrasound treatment of the reaction mixture the semiconductor shell containing chalcogenide and a group II metal is grown using (aminoalkyl) trialkoxysilanes as the surface modifiers at a constant temperature within 150-230 C during 10 min to 1 h.

In some instances, zinc, cadmium, mercury and lead precursors are taken as the group II or IV metal precursor.

In some instances, at both synthesis of cores and semiconductor shell growing, salts of oleic, stearic and other fatty acids containing group II or IV metals, as well as inorganic salts, $CdCl_2$, for example, are used as the precursors.

In a particular case, precursors containing sulfur, selenium and tellurium are used as precursors with chalcogen.

In a particular case, compounds with trioctylphisphineoxide, tributylphosphineoxied and triphenylphosphineoxide are precursors to the precursor containing chalcogen.

In a particular case, (3-aminopropyl)trimethoxysilane and (3-aminopropyl)triethoxysilane are used as the surface modifiers, and unsaturated high-boiling hydrocarbons, for example, octadecene, squalene, as well as diphenyls, terphenyls, diphenyl ether or their derivatives are used as the organic solvent.

In some instances, in the core synthesis, hexadecylamine is used in addition to the modifier.

Figure 1:
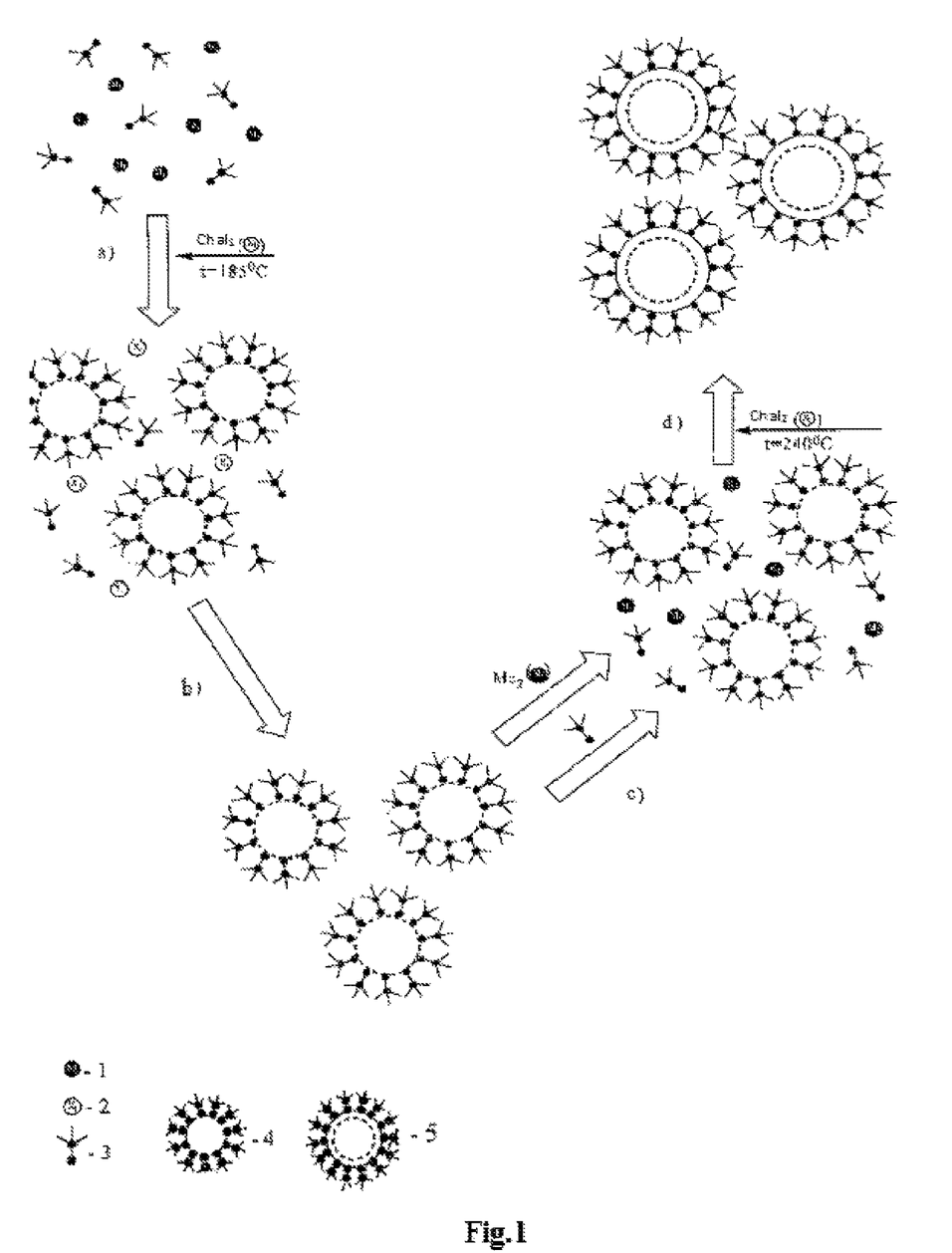

The advantages of this invention are clear from the detailed example of its implementation and attached Figures, where:

FIG. 1 shows the quantum dot synthesis scheme for the core-shell structure, where: a) the group VI chalcogenide precursor injection into the reaction mixture at 185 C giving, as a result, semiconductor quantum dot cores covered with (triaminoalkyl)alkoxysilane; b) reaction mixture purification, UV-light and ultrasound treatment; c) group IV metal precursor and (triaminoalkyl)alkoxysilane injection into the reaction mixture; d) group IV chalcogenide precursor injection into the reaction mixture at a temperature of 240 C giving, as a result, semiconductor quantum dots of the core-shell type covered with (triaminoalkyl)alkoxysilane.

Legend:
1—metal (Cd, Zn, Hg, Pb, Cu, Mn) precursor;
2—chalcogenide (Se, S, Te) precursor;
3—(aminoalkyl)trialkoxysilane;
4—$Me_1 Chal_1$;
5—$Me_1 Chal_1/Me_2 Chal_2$.

EXAMPLES

Example 1

Quantum Dot CdSe Cores Synthesis from Cadmium Stearate

CdSe quantum dots are synthesized by injecting 0.068 g (0.1 mmol) of anhydrous cadmium stearate (cadmium precursor) and (3-aminopropyl)triethoxysilane (1 ml) to 8 ml of octadecene organic solvent (90%) at room temperature (25 C). The reaction mixture is heated up to 185 C, and 0.6 ml of trioctylphosphine selenide (1 M solution in trioctylphosphine) is injected. The semiconductor quantum dots obtained in the reaction are then cooled down to room temperature (25 C). The reaction mixture containing semiconductor quantum dot cores is treated by UV-light (3 min) and ultrasound (10 min). The quantum dots obtained are subsequently dispersed in a non-polar or a polar solvent.

Figure 4:
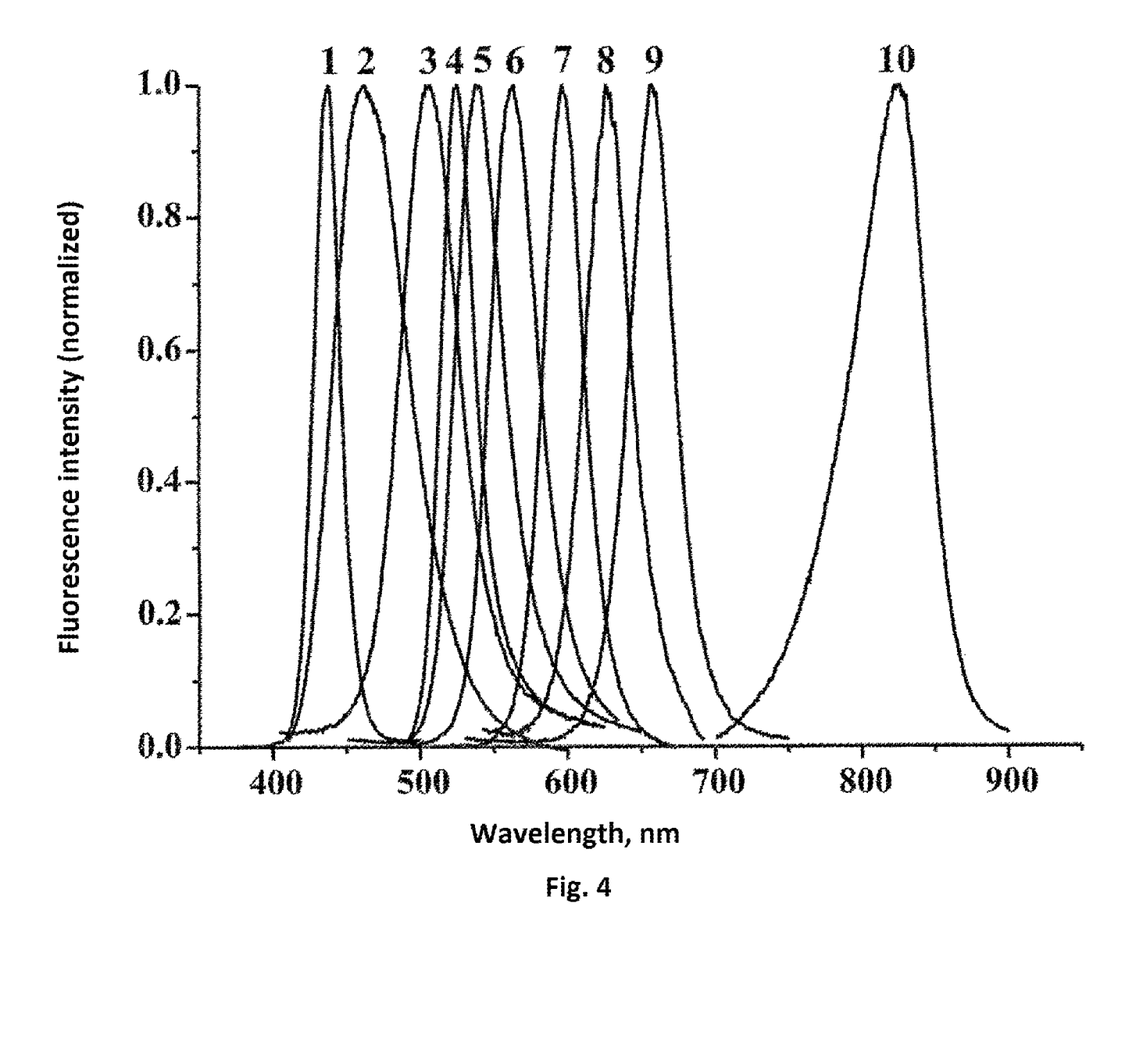

FIG. 4 shows the fluorescence spectrum of the quantum dots from Example 1, where 3 gives the data on the quantum dots produced in Example 1 hereof.

Figure 5:
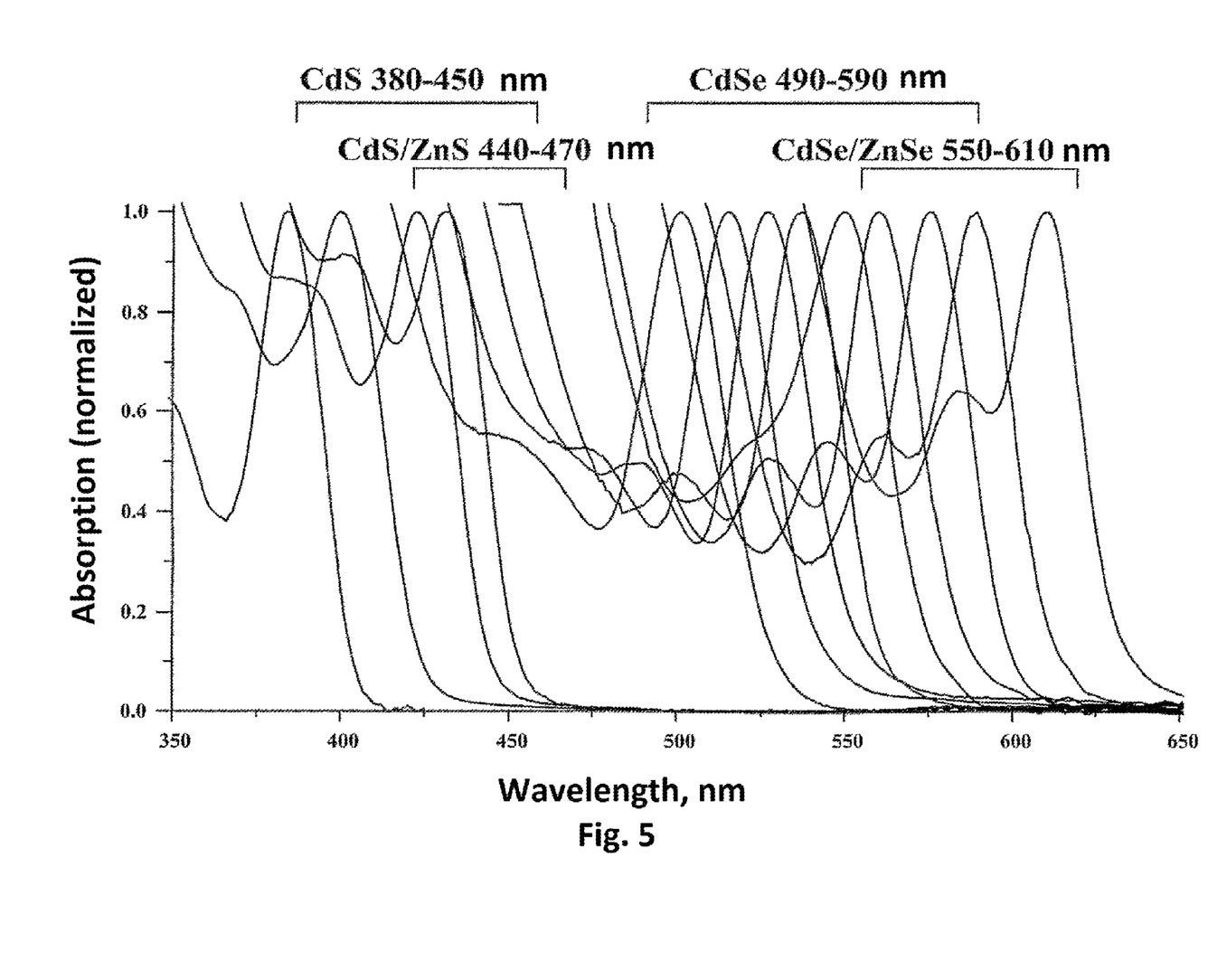

FIG. 5 shows absorption spectra of the cadmium-containing quantum dots.

Figure 3:
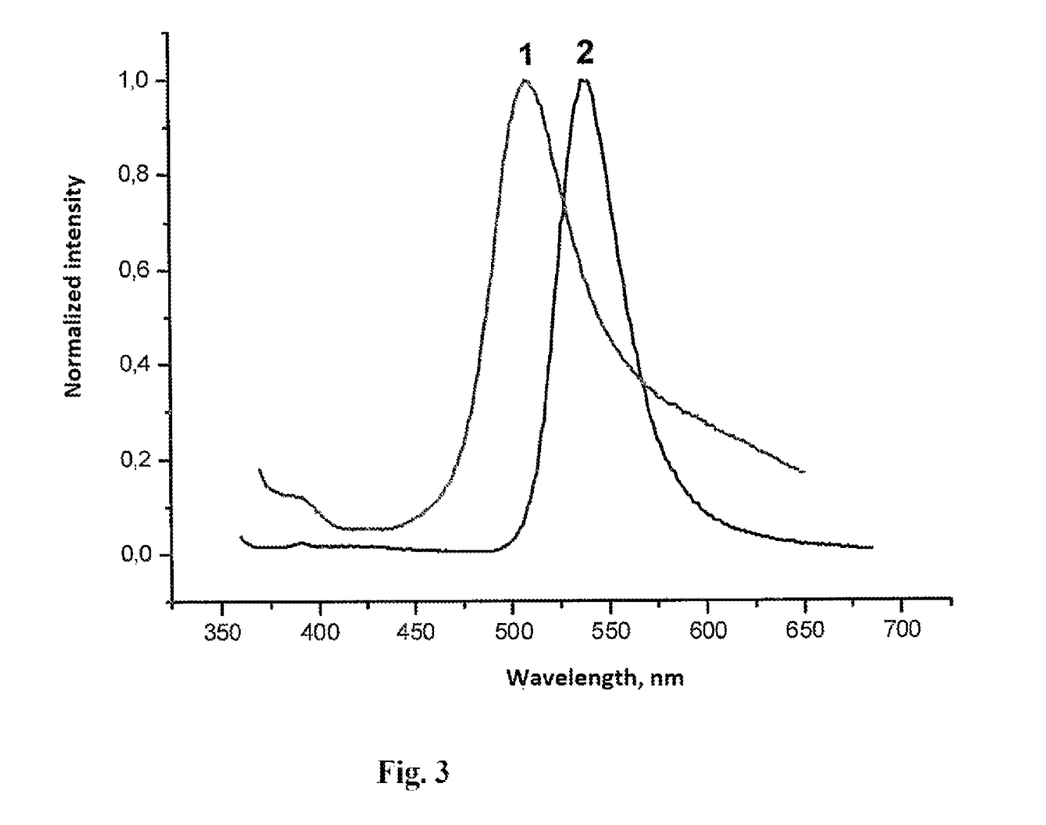
FIG. 3—The effect of the surface modifier nature on the fluorescence spectrum of the quantum dots FIG. 4—Fluorescence spectra of semiconductor quantum dots FIG. 5—Absorption spectra of semiconductor quantum dots FIG. 6—Photostability of semiconductor quantum dots.

FIG. 3 shows the fluorescence spectrum of the quantum dots from Example 1, where 2 gives the data on the quantum dots produced in Example 1 hereof.

Figure 6:
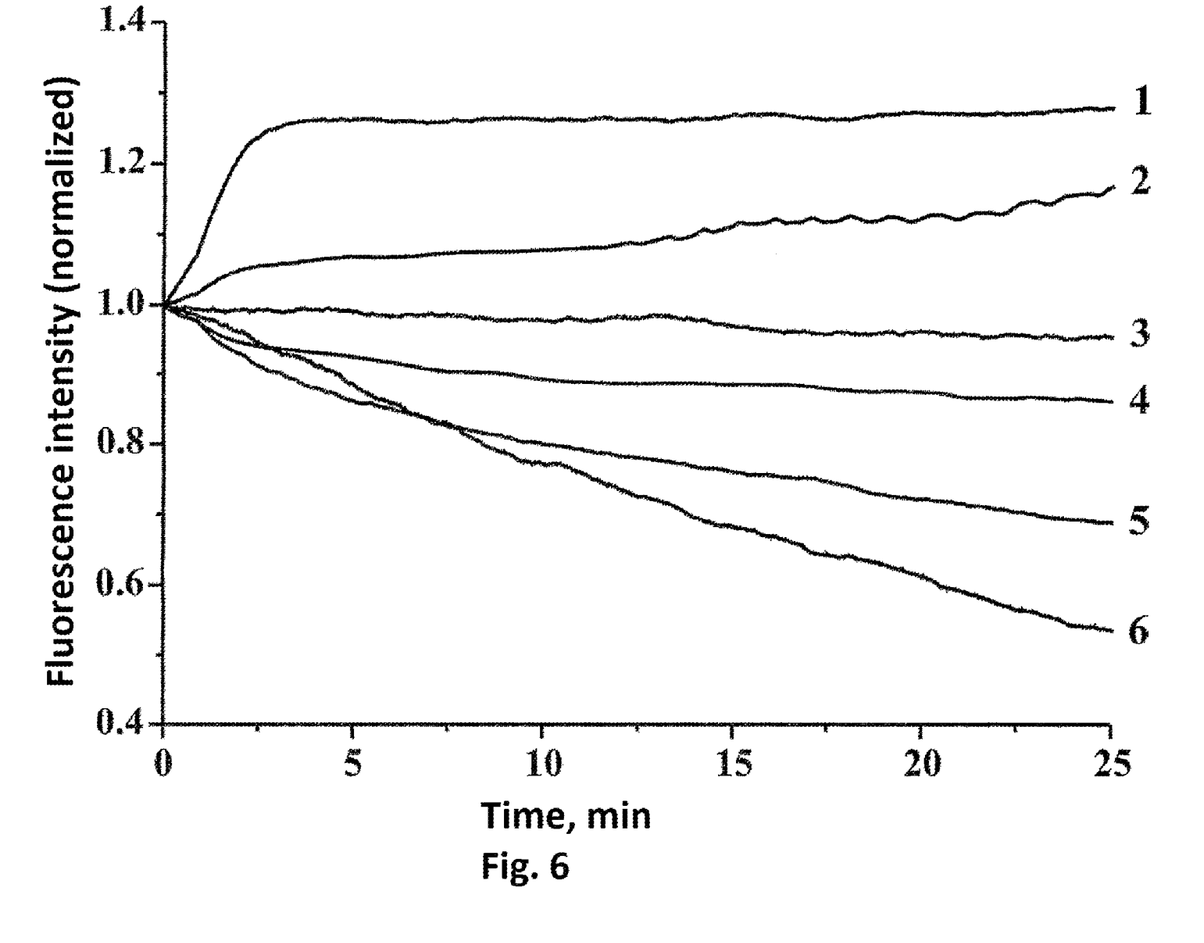

FIG. 6 analyzes photostability of the quantum dots from Example 1, where 1 gives the data on the quantum dots produced in Example 1 hereof.

Example 2

Quantum Dot CdSe Cores Synthesis from Cadmium Stearate

It is performed by analogy to Example 1 with (3-aminopropyl)triethoxysilane at the initial stage a) of the synthesis substituted by hexadecylamine.

FIG. 3 shows the fluorescence spectrum of the quantum dots from Example 2, where 1 gives the data on the quantum dots produced in Example 2 hereof.

FIG. 5 shows absorption spectra of the cadmium-containing quantum dots.

Example 3

Quantum Dot CdSe Cores Synthesis from Cadmium Stearate

It is performed by analogy to Example 1 with the selenium precursor at the initial stage a) in FIG. 1 of the synthesis substituted by the sulfur precursor.

FIG. 4 shows the fluorescence spectrum of the quantum dots from Example 3, where 1 gives the data on the quantum dots produced in Example 3 hereof.

FIG. 5 shows absorption spectra of the cadmium-containing quantum dots.

FIG. 6 analyzes photostability of the quantum dots from Example 3, where 2 gives the data on the quantum dots produced in Example 3 hereof.

Example 4

Quantum Dot CdSe Cores Synthesis from Cadmium Stearate

It is performed by analogy to Example 2 with the organic solvent octadecene substituted by diphenyl ether.

FIG. 5 shows absorption spectra of the cadmium-containing quantum dots.

FIG. 4 shows the fluorescence spectrum of the quantum dots from Example 4, where 6 gives the data on the quantum dots produced in Example 4 hereof.

Example 5

Quantum Dot ZnSe Cores Synthesis from Zinc Stearate

It is performed by analogy to Example 1 with the cadmium precursor substituted by the zinc precursor.

FIG. 4 shows the fluorescence spectrum of the quantum dots from Example 5, where 2 gives the data on the quantum dots produced in Example 5 hereof.

Example 6

Quantum Dot PbSe Cores Synthesis from Lead Stearate

It is performed by analogy to Example 2 with the cadmium precursor substituted by the lead precursor.

FIG. 4 shows the fluorescence spectrum of the quantum dots from Example 6, where 10 gives the data on the quantum dots produced in Example 6 hereof.

Example 7

Quantum Dot CdSe Cores Synthesis from Cadmium Chloride

It is performed by analogy to Example 1 with anhydrous cadmium chloride taken for the cadmium precursor.

FIG. 5 shows absorption spectra of the cadmium-containing quantum dots.

FIG. 4 shows the fluorescence spectrum of the quantum dots from Example 7, where 9 gives the data on the quantum dots produced in Example 7 hereof.

Example 8

Quantum Dot CdSe Cores Synthesis from Cadmium Chloride

It is performed by analogy to Example 7 with the mixture heated up to 220 C.

FIG. 4 shows the fluorescence spectrum of the quantum dots from Example 8, where 8 gives the data on the quantum dots produced in Example 8 hereof.

FIG. 5 shows absorption spectra of the cadmium-containing quantum dots.

Example 9

Quantum Dot CdSe Cores Synthesis from Cadmium Chloride

It is performed by analogy to Example 7 with Cd:Se ratio being 1:2 at the stages of semiconductor quantum dot synthesis.

FIG. 4 shows the fluorescence spectrum of the quantum dots from Example 9, where 7 gives the data on the quantum dots produced in Example 9 hereof.

FIG. 5 shows absorption spectra of the cadmium-containing quantum dots.

Example 10

Quantum Dot CdSe Cores Synthesis from Cadmium Oleate

It is performed by analogy to Example 1 with cadmium oleate taken for the cadmium precursor.

FIG. 4 shows the fluorescence spectrum of the quantum dots from Example 10, where 5 gives the data on the quantum dots produced in Example 10 hereof.

FIG. 5 shows absorption spectra of the cadmium-containing quantum dots.

Example 11

Core/Shell CdSe/ZnSe Quantum Dot Synthesis

The reaction mixture with the semiconductor quantum dots produced by Example 1 is added by 0.072 mg (0.17 mmol) of zinc undecylenate (98%). To produce quantum dots of the core-shell type, the subsequent stages are performed as follows: a) after zinc undecylenate (zinc precursor) dissolution at 150 C., the reaction mixture is cooled down to room temperature; b) the reaction mixture at room temperature is added by (3-aminopropyl)triethoxysilane and heated up (to 240 C); c) after adding trioctylphosphine selenide (0.17 ml, 1 M solution in trioctylphosphine) and conduction of the reaction, the mixture is cooled down to room temperature.

FIG. 4 shows the fluorescence spectrum of the quantum dots from Example 11, where 4 gives the data on the quantum dots produced in Example 11 hereof.

FIG. 5 shows absorption spectra of the cadmium-containing quantum dots.

FIG. 6 analyzes the photostability of the quantum dots, where 3 gives the data on the quantum dots produced in Example 11 hereof

TABLE

Comparative analysis of the quantum dots produced under the invention and the prototype

| Example No. | Quantum dot composition | Photostability, % | Fluorescence quantum yield, % | Dispersing ability |
|---|---|---|---|---|
| Example 1 | CdSe | +34 | 32 | In polar and non-polar solvents |
| Example 3 | CdS | +21 | 21 | In polar and non-polar solvents |
| Example 5 | ZnSe | Intensity did not change | 15 | In polar and non-polar solvents |
| Example 6 | PbSe | Intensity did not change | 10 | In polar and non-polar solvents |
| Example 11 | CdSe/ZnSe | −8 | 64 | In polar and non-polar solvents |
| Prototype | CdSe | −50 | 34 | In non-polar solvents only |
| Prototype | CdS | −19 | 18 | In non-polar solvents only |
| Prototype | CdSe/ZnSe | −42 | 60 | In non-polar solvents only |

Note.
Photostability was studied by 30-minutes Nd:YAG solid pulse laser irradiation, model FTSS 355-50, with 355 nm wavelength, specific radiation power of 2.5-7.5 mW/cm$^2$ and pulse frequency of 1 kHz.

The Table shows that, in contrast with the prototype, the production method under the invention increases photostability and preserves the quantum yield and dispersing ability in both polar and non-polar solvents.

The declared method produces semiconductor quantum dots of the core and the core-shell types possessing high photostability and being able to disperse in various solvents without additional treatment, hence, preserving the given optical properties. The method is scaled up to the industrial output. The quantum dots produced by this method can be used in IR photodetectors, solar cells, subminiature light-emitting diodes, white light sources, single-electron transistors and nonlinear optical devices, as well as for medical purposes as optical sensors, fluorescent markers, and photosensitizers.

We claim:

1. A method for semiconductor quantum dot production on the basis of group II or group IV metal chalcogenides comprising: a nanocrystal core synthesis from a precursor containing a chalcogen and a precursor containing a group II or IV metal with the use of an organic solvent and a surface modifier wherein (aminoalkyl) trialkoxysilanes application are used as the modifiers and said cores are synthesized at a constant temperature ranging within 150° C.-250° C. for 15 seconds to 1 hour, and a reaction mixture containing the nanocrystal cores is additionally treated by UV-light for a duration of 1-10 minutes and ultrasound for a duration of 5-15 minutes.

2. The method of claim 1 wherein prior to UV-light and ultrasonic treatment of the reaction mixture, the semiconductor shell containing a group II metal chalcogenide is grown at a constant temperature ranging within 150-230 C for 10 minutes to 1 hour, applying (aminoalkyl)trialkoxysilanes as the surface modifiers.

3. The method of claim 2 wherein both synthesis of the cores and semiconductor shell growth, the salts of oleic, stearic and other fatty acids containing group II or IV metals, as well as inorganic salts, for example $CdCl_2$, are applied to as the precursors.

4. The method of claim 2 wherein the surface modifiers are (3-aminopropyl)trimethoxysilane and (3-aminopropyl)triethoxysilane, and organic solvents are unsaturated high-boiling hydrocarbons, one of octadecene, squalene, as well as diphenyls, terphenyls, diphenyl ether or their derivatives.

5. The method of claim 1 wherein after UV-light and ultrasonic treatment of the reaction mixture, the semiconductor shell containing a chalcogenide and a group II metal is grown at a constant temperature ranging within 150-230 C for 10 minutes to 1 hour, applying (aminoalkyl)trialkoxysilanes as the surface modifiers.

6. The method of claim 5 wherein both synthesis of the cores and semiconductor shell growth, the salts of oleic, stearic and other fatty acids containing group II or IV metals, as well as inorganic salts, for example $CdCl_2$, are applied to as the precursors.

7. The method of claim 5 wherein the surface modifiers are (3-aminopropyl)trimethoxysilane and (3-aminopropyl)triethoxysilane, and organic solvents are unsaturated high-boiling hydrocarbons, one of octadecene, squalene, as well as diphenyls, terphenyls, diphenyl ether or their derivatives.

8. The method of claim 1 wherein the precursors containing zinc, cadmium, mercury and lead are used.

9. The method of claim 1 wherein both synthesis of the cores and semiconductor shell growth, the salts of oleic, stearic and other fatty acids containing group II or IV metals, as well as inorganic salts, for example $CdCl_2$, are applied to as the precursors.

10. The method of claim 1 wherein the precursors containing sulfur, selenium and tellurium are used.

11. The method of claim 1 wherein the precursor chalcogenide comprise compounds of chalcogenide with the following trioctylphosphineoxide, tributylphosphineoxide and triphenylphosphineoxide.

12. The method of claim 1 wherein the surface modifiers are (3-aminopropyl)trimethoxysilane and (3-aminopropyl)triethoxysilane, and organic solvents are unsaturated high-boiling hydrocarbons, one of octadecene, squalene, as well as diphenyls, terphenyls, diphenyl ether or their derivatives.

13. The method of the claim 1 wherein in addition to the surface modifier, hexadecylamine is applied.

* * * * *